(12) United States Patent
Krah

(10) Patent No.: US 9,436,315 B2
(45) Date of Patent: Sep. 6, 2016

(54) NOISE REJECTION CIRCUIT FOR TOUCH SENSITIVE DISPLAY

(75) Inventor: Christoph Horst Krah, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 1058 days.

(21) Appl. No.: 13/234,082

(22) Filed: Sep. 15, 2011

(65) Prior Publication Data

US 2013/0069904 A1 Mar. 21, 2013

(51) Int. Cl.
G06F 3/045 (2006.01)
G06F 3/041 (2006.01)
G06F 3/044 (2006.01)

(52) U.S. Cl.
CPC ............. *G06F 3/0418* (2013.01); *G06F 3/044* (2013.01); *H03K 2217/960705* (2013.01)

(58) Field of Classification Search
CPC .............................. G06F 3/044; G06F 3/0418
USPC .................... 345/174; 327/379, 553
See application file for complete search history.

(56) References Cited

U.S. PATENT DOCUMENTS

| | | | |
|---|---|---|---|
| 5,483,261 A | 1/1996 | Yasutake | |
| 5,488,204 A | 1/1996 | Mead et al. | |
| 5,825,352 A | 10/1998 | Bisset et al. | |
| 5,835,079 A | 11/1998 | Shieh | |
| 5,880,411 A | 3/1999 | Gillespie et al. | |
| 6,188,391 B1 | 2/2001 | Seely et al. | |
| 6,310,610 B1 | 10/2001 | Beaton et al. | |
| 6,323,846 B1 | 11/2001 | Westerman et al. | |
| 6,690,387 B2 | 2/2004 | Zimmerman et al. | |
| 7,015,894 B2 | 3/2006 | Morohoshi | |
| 7,184,064 B2 | 2/2007 | Zimmerman et al. | |
| 7,663,607 B2 | 2/2010 | Hotelling et al. | |
| 7,683,887 B2 | 3/2010 | Yasukawa | |
| 8,479,122 B2 | 7/2013 | Hotelling et al. | |
| 2004/0104866 A1* | 6/2004 | Sano et al. ................ | 345/60 |
| 2005/0122119 A1* | 6/2005 | Barlow ................ | 324/662 |
| 2006/0026521 A1 | 2/2006 | Hotelling et al. | |
| 2006/0197753 A1 | 9/2006 | Hotelling | |
| 2008/0062148 A1* | 3/2008 | Hotelling et al. ........... | 345/174 |
| 2010/0060593 A1* | 3/2010 | Krah ............................ | 345/173 |
| 2010/0079401 A1 | 4/2010 | Staton | |
| 2010/0079402 A1 | 4/2010 | Grunthaner et al. | |

(Continued)

FOREIGN PATENT DOCUMENTS

JP 2000-163031 A 6/2000
JP 2002-342033 A 11/2002

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

(Continued)

*Primary Examiner* — Kent Chang
*Assistant Examiner* — Scott Au
(74) *Attorney, Agent, or Firm* — Morrison & Foerster LLP

(57) ABSTRACT

A noise rejection circuit for a touch sensitive display is disclosed. The noise rejection circuit can reject noise introduced by the touch sensitive display's display device into its touch panel. The noise rejection circuit can be integrated into the touch circuitry of the touch sensitive display and can include a resistor to sense the noise and an amplifier to isolate the sensed noise for rejection.

26 Claims, 9 Drawing Sheets

(56) References Cited

U.S. PATENT DOCUMENTS

2011/0115729 A1 5/2011 Kremin et al.
2012/0268145 A1* 10/2012 Chandra et al. .............. 324/686

OTHER PUBLICATIONS

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.
Rubine, D.H. (May 1992). "Combining Gestures and Direct Manipulation," CHI ' 92, pp. 659-660.
Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

* cited by examiner

NOISE REJECTION CIRCUIT FOR TOUCH SENSITIVE DISPLAY

FIELD

This relates generally to touch sensitive displays and more particularly to noise rejection circuitry for touch sensitive displays.

BACKGROUND

Many types of input devices are presently available for performing operations in a computing system, such as buttons or keys, mice, trackballs, joysticks, touch sensor panels, touch screens and the like. Touch sensitive displays in particular are popular because of their ease and versatility of operation as well as their declining price. A touch sensitive display can include a touch sensor panel, which can be a clear panel with a touch sensitive surface, and a display device such as a liquid crystal display (LCD) that can be positioned partially or fully behind the panel or integrated with the panel so that the touch sensitive surface can cover at least a portion of the viewable area of the display device. The touch sensitive display can allow a user to perform various functions by touching or hovering over the touch sensor panel using a finger, stylus or other object at a location often dictated by a user interface (UI) being displayed by the display device. In general, the touch sensitive display can recognize a touch or hover event and the position of the event on the touch sensor panel. The computing system can then interpret the event in accordance with the display appearing at the time of the event, and thereafter can perform one or more actions based thereon.

In some instances, the performance of the touch sensor panel can be adversely affected by the proximity of the display device, consequently affecting recognition and interpretation of a touch or hover event. With the development of larger panels and display devices, which increase the sizes of the affected areas, and thinner touch sensitive displays, which bring the panel and display device into closer proximity, the adverse effects on touch and hover events have increased.

SUMMARY

This relates to a noise rejection circuit for a touch sensitive display. The noise rejection circuit can reject noise introduced by the touch sensitive display's display device into its touch panel. The noise rejection circuit can be integrated into touch circuitry of the touch sensitive display and can include a resistor to sense the noise and an amplifier to isolate the sensed noise for rejection. By having the noise rejection circuit, the touch sensitive display can advantageously be thinner because any noise exacerbated by the proximity of the display device and the touch panel can be rejected. The touch sensitive display can also be larger because any noise increase, due to the increased display area from which noise can be generated, can be rejected. Additionally, touch panel sensing can be improved by providing sense signals with little or no noise.

DETAILED DESCRIPTION

In the following description of example embodiments, reference is made to the accompanying drawings in which it is shown by way of illustration specific embodiments that can be practiced. It is to be understood that other embodiments can be used and structural changes can be made without departing from the scope of the various embodiments.

This relates to a noise rejection circuit for a touch sensitive display. The noise rejection circuit can reject noise introduced by a display device into a touch panel of the touch sensitive display. The noise can be caused by the display device undesirably capacitively coupling with the touch panel. The noise rejection circuit can be integrated into the touch circuitry of the touch sensitive display and can include a resistor to sense the noise and/or an amplifier to isolate the sensed noise for rejection. By having the noise rejection circuitry, the touch sensitive display can be thinner because any noise exacerbated by the proximity of the display device and the touch panel can be rejected. The touch sensitive display can also be larger because any noise increase due to the increased display area from which noise can be generated, can be rejected. Additionally, touch panel sensing can be improved by providing sense signals with little or no noise.

The noise rejection circuit according to various embodiments can advantageously reject noise with little or no effect on the sense signals because the noise can be sensed and isolated on the drive side of the touch panel, i.e., prior to the touch panel receiving a stimulation signal to drive the panel to sense a touch or hover event and then generating a sense signal indicative of the event. As a result, the sense signals can avoid becoming common mode signals that can inadvertently cross couple with and be subtracted from other sense signals to cause erroneous sense signals.

Figure 1:
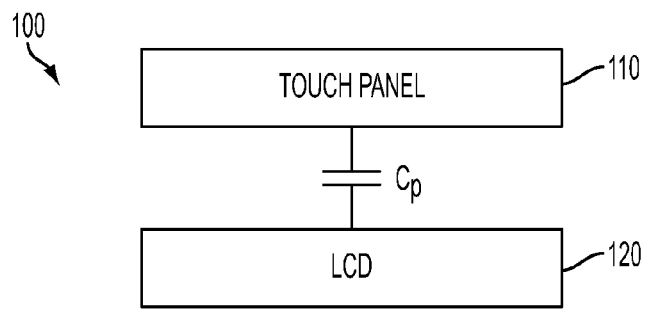
FIG. 1 illustrates an exemplary touch sensitive display according to various embodiments.
Figure 2:
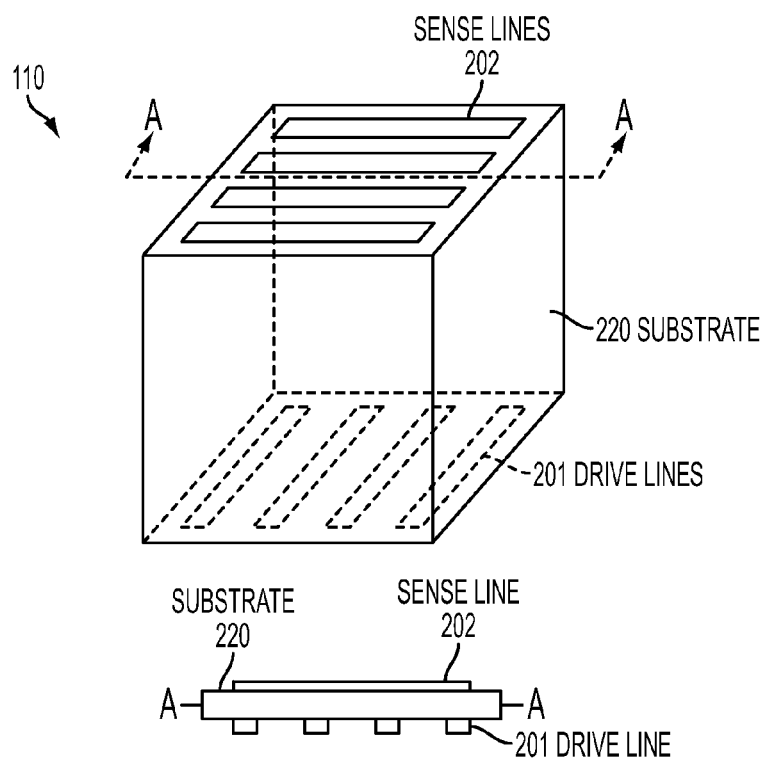
FIG. 2 illustrates an exemplary touch panel for a touch sensitive display according to various embodiments.

FIG. 1 illustrates an exemplary touch sensitive display according to various embodiments. In the example of FIG. 1, touch sensitive display 100 can include touch sensor panel 110 and LCD 120, which can undesirably be capacitively coupled (illustrated by Cp), causing LCD noise on the panel, as described in detail below. The panel 110 can be the exemplary panel of FIG. 2. In the example of FIG. 2, the panel 110 can include substrate 220 having conductive lines 202 formed on one surface of the substrate and conductive lines 201 formed on an opposite substrate surface. It should be noted, however, that in other embodiments, the conductive lines 201, 202 can be formed on the same side of the substrate 220, or on different substrates. The conductive lines 201 can be drive lines for driving the panel 110 with stimulation signals from drive circuitry (not shown) in order to sense a touching or hovering object at the panel. The conductive lines 202 can be sense lines for transmitting sense signals indicative of the sensed touching or hovering object from the panel 110 to sensing circuitry (not shown) for further processing. The conductive lines 201, 202 can cross each other to define touch pixels at which the object is sensed.

Figure 3:
FIG. 3 illustrates an exemplary LCD for a touch sensitive display according to various embodiments.

The LCD 120 can be the exemplary LCD of FIG. 3 or other similar LCD structures. In the example of FIG. 3, the LCD 120 can include first polarizer 321, color filter 322, Vcom layer 323, liquid crystals 324, thin film transistor (TFT) layer 325, and second polarizer 326. The first polarizer 321 can polarize light transmitted through the LCD 120. The color filter 322 can provide the RGB colors that are displayed. The Vcom layer 323 can provide a common voltage to drive the display pixels of the TFT layer 325. The Vcom layer 323 can be maintained at a constant voltage or modulated with an AC signal. The TFT layer 325 can provide the display pixels to operate the LCD 120. The second polarizer 326 can polarize light transmitted to the LCD 120 from an adjacent light source, e.g., a backlight. To display data on the LCD 120, the Vcom layer 323 can drive the display pixels in the TFT layer 325, which can cause the liquid crystals 324 to align and allow light from an adjacent light source to pass through and the color filter 322 to display RGB colors indicative of the display data on the LCD.

In some instances, the LCD 120 can undesirably capacitively couple with the touch panel 110, introducing noise into the panel that can affect touch and hover sensing. The noise can be caused by the Vcom layer 323 as follows. As mentioned previously, the Vcom layer 323 can be modulated with an AC signal. The modulating signal can be capacitively coupled through the drive lines 201 of the panel 110 and onto the sense lines 202 of the panel. Although the modulated Vcom layer can capacitively couple with the drive lines 201, because the drive lines are being driven with stimulation signals by drive circuitry with low impedance outputs, any capacitive coupling can be shunted to the drive circuitry with negligible effect. However, because sense lines 202 are configured to sense small changes in capacitance at the panel 110, capacitive coupling with the modulated Vcom layer can easily be seen as noise at the sense circuitry. The capacitive coupling between the sense lines 202 and the Vcom layer 323 can be exacerbated by the resistive nature of the drive lines 201. Because the drive lines 201 can be made from indium-tin-oxide (ITO), they can have a finite resistance and therefore shunt only part of the Vcom noise to the drive circuitry. The remaining Vcom noise on the drive lines 201 can be coupled from the drive lines to the sense lines 202, where the amount of the remaining Vcom noise can be dependent on the corner frequency of the high-pass filter formed by the coupling capacitances from the Vcom layer to the drive lines to the sense lines and the resistive component of the drive lines.

Although noise introduced by the Vcom layer of the LCD is described herein, it is to be understood noise introduced by other components of the touch sensitive display or other components of adjacent devices can also be rejected by noise rejection circuitry according to various embodiments.

Figure 4:
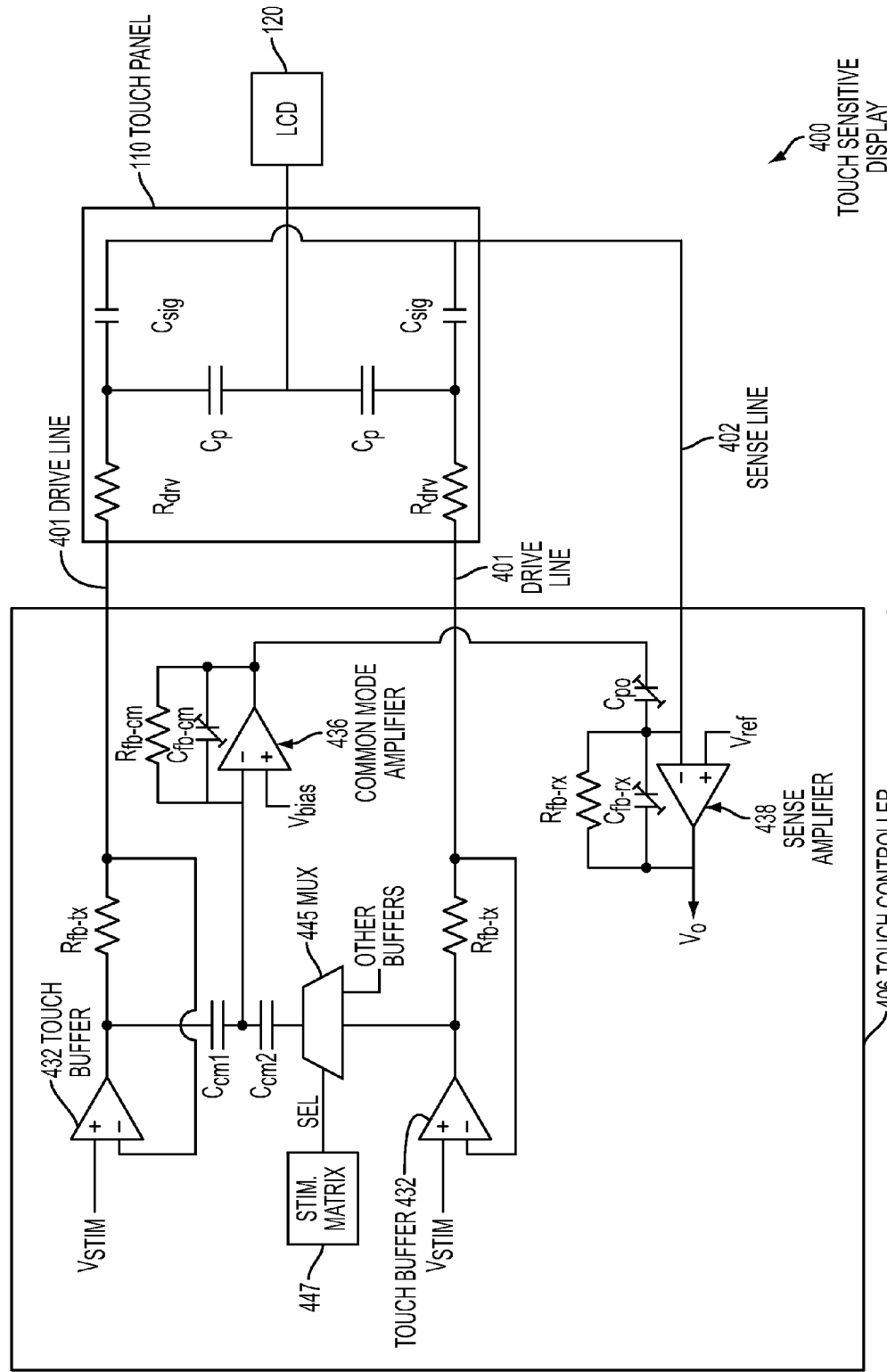
FIG. 4 illustrates an exemplary noise rejection circuit for a touch sensitive display according to various embodiments.

FIG. 4 illustrates an exemplary noise rejection circuit that can be used in the touch sensitive display of FIG. 1 to reject noise introduced by the LCD into the touch panel. In the example of FIG. 4, touch sensitive display 400 can include touch panel 110, LCD 120, and touch controller 406 with noise rejection circuitry. The touch controller 406 can include touch buffers 432 coupled to drive lines 401 of the touch panel 110 to transmit stimulation signals Vstim to the panel to drive the panel. Vstim can be a positive (+) phase stimulation signal Vstim+ or a negative (−) phase stimulation signal Vstim− having the same waveform as Vstim+ inverted about a common voltage. Each buffer 432 can transmit either Vstim+ or Vstim− based on the drive pattern of the display 400.

The touch controller 406 can also include sense amplifiers 438 coupled to sense lines 402 of the touch panel 110 to receive sense signals indicative of a change in Csig (a mutual capacitance formed between a drive line and a sense line at a touch pixel) and a sensed touch or hover at the panel. In some embodiments, each sense line 402 can connect to a different sense amplifier 438. In some embodiments, multiple sense lines 402 can share a sense amplifier 438, with a switch between the sense lines and the sense amplifier to sequentially connect each sense line to the amplifier.

The LCD 120 via the Vcom layer 323 can capacitive couple (illustrated by Cp) to the panel 110, thereby introducing Vcom noise into the panel 110. The Vcom noise can be propagated through the panel 110, thereby reducing touch and hover sensing accuracy. To prevent this from happening, noise rejection circuitry can be integrated into the touch controller 406, as illustrated in FIG. 4. The noise rejection circuitry can include feedback resistors (illustrated by Rfb_tx) in the touch buffers 432. A resistor Rfb_tx can be placed in a feedback loop of a touch buffer 432 to isolate and amplify the Vcom signal in preparation for noise rejection at the display 400. Current from the LCD Vcom layer can go through the feedback resistor Rfb_tx to isolate the Vcom signal, where the voltage drop across the resistor can be a function of the Vcom current through capacitance Cp and drive line resistor Rdrv into the output of the touch buffers 432. The Vcom signal can also be amplified as a function of the resistor size, where the Vcom gain of the touch buffer 432 can be approximately $2 \cdot \pi \cdot fvcom \cdot Rfb\_tx \cdot Cp$, where fvcom is the frequency of the Vcom signal component. In some embodiments, the resistor Rfb_tx can be variable so as to cause adjustments to the buffer gain and hence to the Vcom signal according to the noise rejection capabilities of the display. The Vcom voltage at the resistor can cause a disturbance in the outputs of the buffers 432, such that each buffer output has two components, the stimulation signal Vstim and the Vcom signal. As such, the next task can be to determine the Vcom noise component in the buffer output and isolate that component.

To do so, the noise rejection circuitry can also include common mode amplifier 436. The common mode amplifier 436 can isolate the Vcom signal at the output of the touch buffers 432, while canceling the stimulation signals also present at the output. To cancel the stimulation signals, stimulation signals of opposite polarity can be combined as inputs to the common mode amplifier 436 as follows. Multiplexer 445 can receive a group of touch buffer outputs and can select via selection signal SEL one of the outputs having a desirable Vstim polarity. The multiplexer 445 can then output that selected touch buffer output for coupling with a touch buffer output having a Vstim opposite polarity. Stimulation matrix 447 can store the drive pattern of the display 400 and can determine, based on the drive pattern, which touch buffer output to select. The stimulation matrix 447 can then send the selection signal SEL to the multiplexer 445 to indicate which touch buffer output to select. In some embodiments, multiple multiplexers can be used, where one multiplexer can select one touch buffer output from among a group of outputs and another multiplexer can select another touch buffer output from among another group of outputs, such that the two selected outputs have opposite polarity.

The outputs of touch buffers 432 (one output via the multiplexer 445), where one buffer outputs Vstim+ and Vcom and the other buffer outputs Vstim− and Vcom, can be combined via coupling capacitances Ccm1 and Ccm2 and inputted to the amplifier 436. Because the Vstim signals are opposite polarity, they can cancel each other out, leaving the common mode Vcom signal as input to the amplifier 436, thereby isolating the Vcom noise component in the input.

Figure 7:
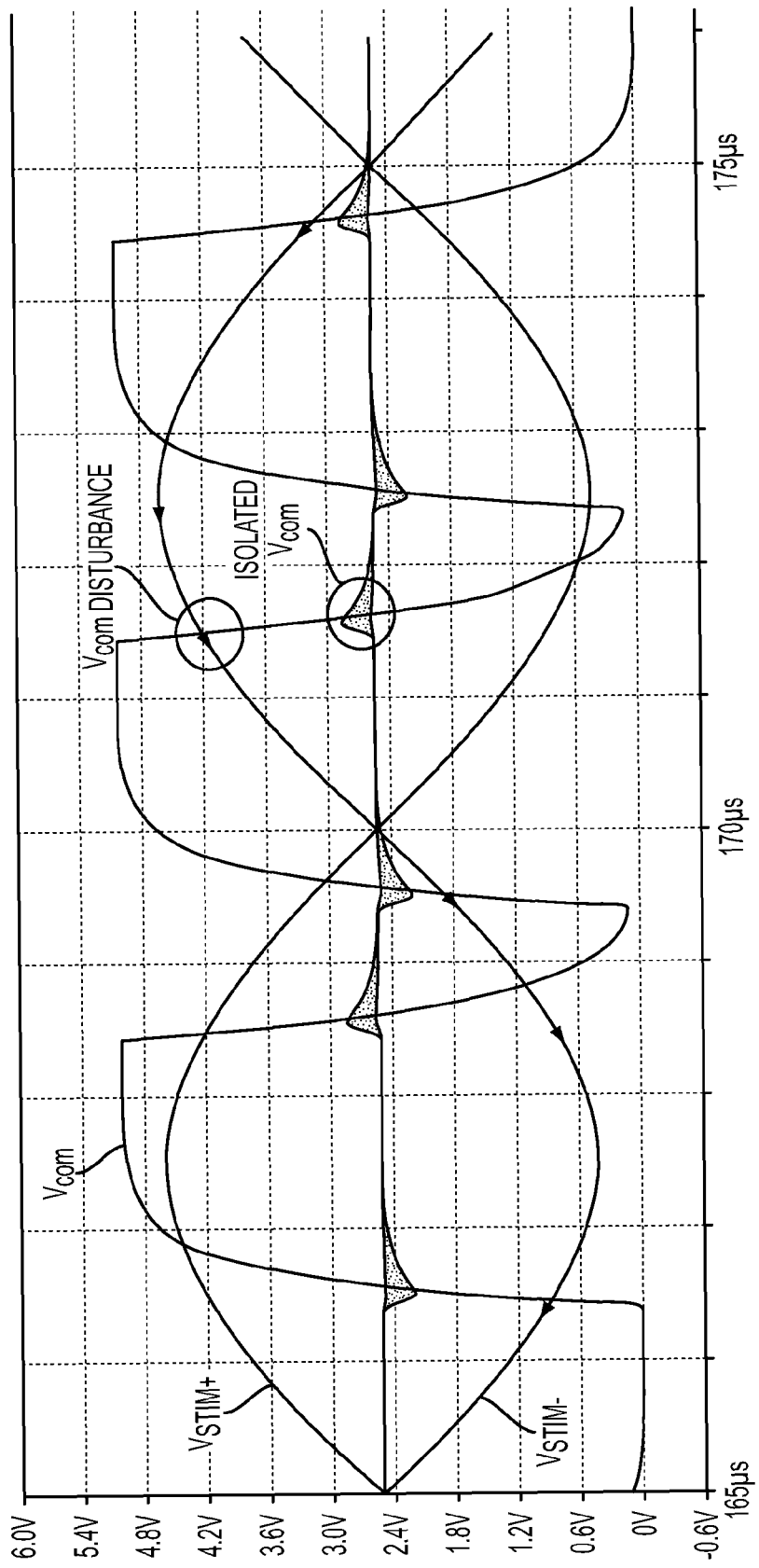
FIG. 7 is a graph depicting exemplary noise rejection results in a touch sensitive display according to various embodiments.

FIG. 7 graphically depicts exemplary noise isolation at the output of the common mode amplifier according to various embodiments. Stimulation signals Vstim+ and Vstim− are shown, having been provided by touch circuitry of the touch sensitive display. Common voltage signal Vcom is also shown, having been provided by the LCD Vcom layer of the touch sensitive display. The Vstim signals show disturbances introduced by the Vcom layer's capacitive coupling with the touch panel at the touch buffers. The output of the common mode amplifier of the touch sensitive display is also shown, in which the Vcom signal has been isolated in preparation for noise rejection. The output does not include the Vstim signals because they have coupled together and canceled each other out at the amplifier input.

Referring again to FIG. 4, the isolated Vcom signal can be amplified by the common mode amplifier 436 in preparation for noise rejection at the display 400. The Vcom signal can be amplified as a function of the size of the amplifier capacitor (illustrated by Cfb_cm), where the gain of the common mode amplifier 436 can be approximately (Ccm1+Ccm2)/Cfb_cm, assuming the impedance of Cfb_cm is much lower than that of the amplifier resistor Rfb_cm. In some embodiments, the capacitor Cfb_cm can be variable so as to cause adjustments to the amplifier gain and hence to the Vcom signal according to the noise rejection capabilities of the display. The next task can be to reject the Vcom noise component.

To do so, the output of the common mode amplifier 436, i.e., the isolated Vcom signal, can be capacitively coupled (illustrated by Cpo) to the sense signal (illustrated by Csig) generated by the touch panel 110 and inputted to the sense amplifier 438 for processing the sense signal. As illustrated in FIG. 4, the touch panel 110 can receive the outputs of the touch buffers 432, which include Vstim and Vcom signals. The touch panel 110 can then generate the sense signals from the inputted Vstim and Vcom signals. As a result, the sense signals can include the Vcom signals. By combining the sense signals with the common mode amplifier output, the Vcom signals can cancel each other out, leaving only the sense signals as input to the sense amplifier 438. Hence, the Vcom noise component has been rejected. The amount of the Vcom signal introduced into each sense line 402 of the touch panel 110 can vary from line to line. Therefore, the isolated Vcom signal Cpo can be adjusted on a per sense line basis to allow the correct amount of Vcom noise cancellation for a given sense line 402.

Figure 8:
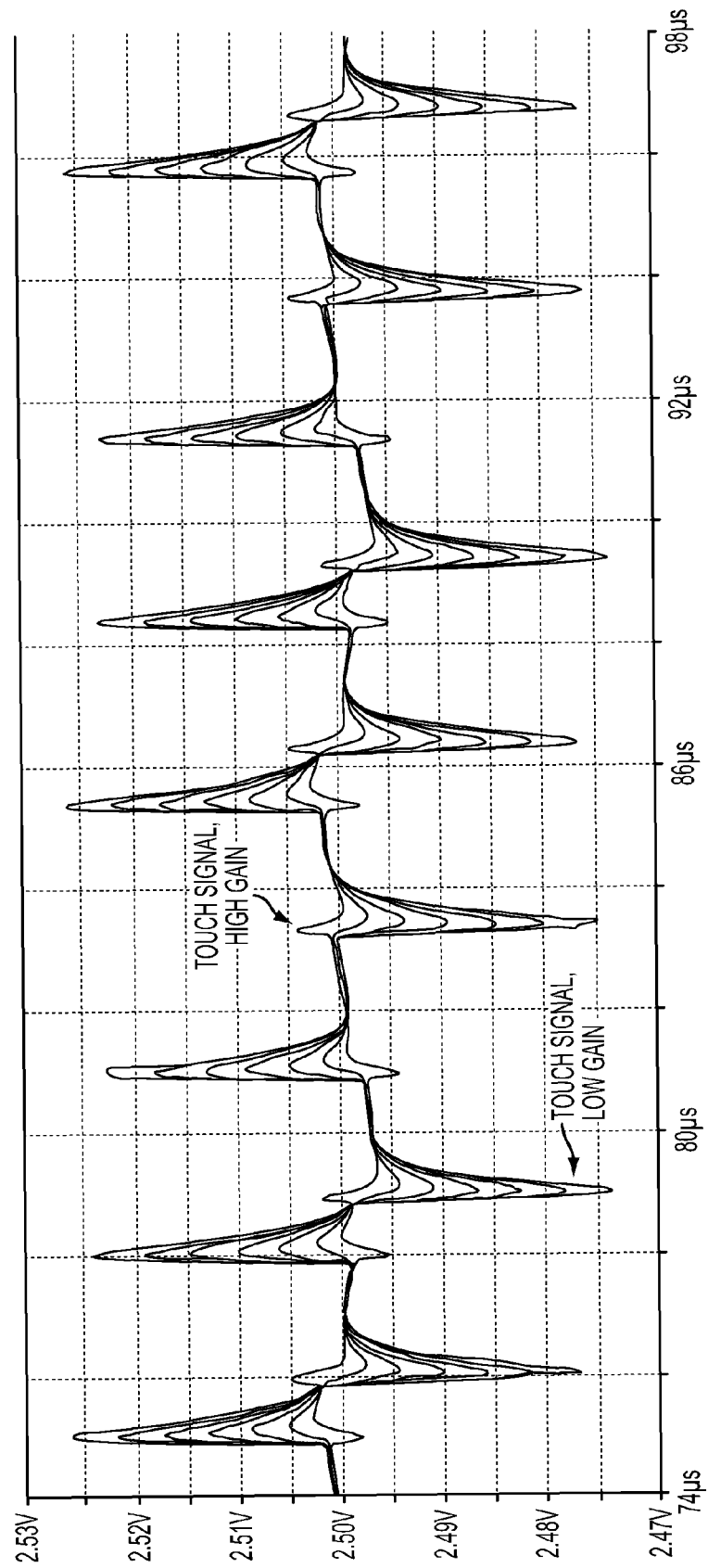
FIG. 8 is a graph depicting exemplary noise rejection results as a function of gain in a noise rejection circuit of a touch sensitive display according to various embodiments.

FIG. 8 graphically depicts how various common mode amplifier gains can affect the amount of noise rejected according to various embodiments. Sense signals outputted by a sense amplifier of the touch sensitive display are shown at various common mode amplifier gains. The larger the common mode amplifier gain, the better the noise rejection. For example, as shown in FIG. 8, the sense signal at a high gain is prominent, whereas the smaller the common mode amplifier gain, the poorer the noise rejection. For example, as shown in FIG. 8, the sense signal at a low gain is overcome by the Vcom signal.

Figure 5:
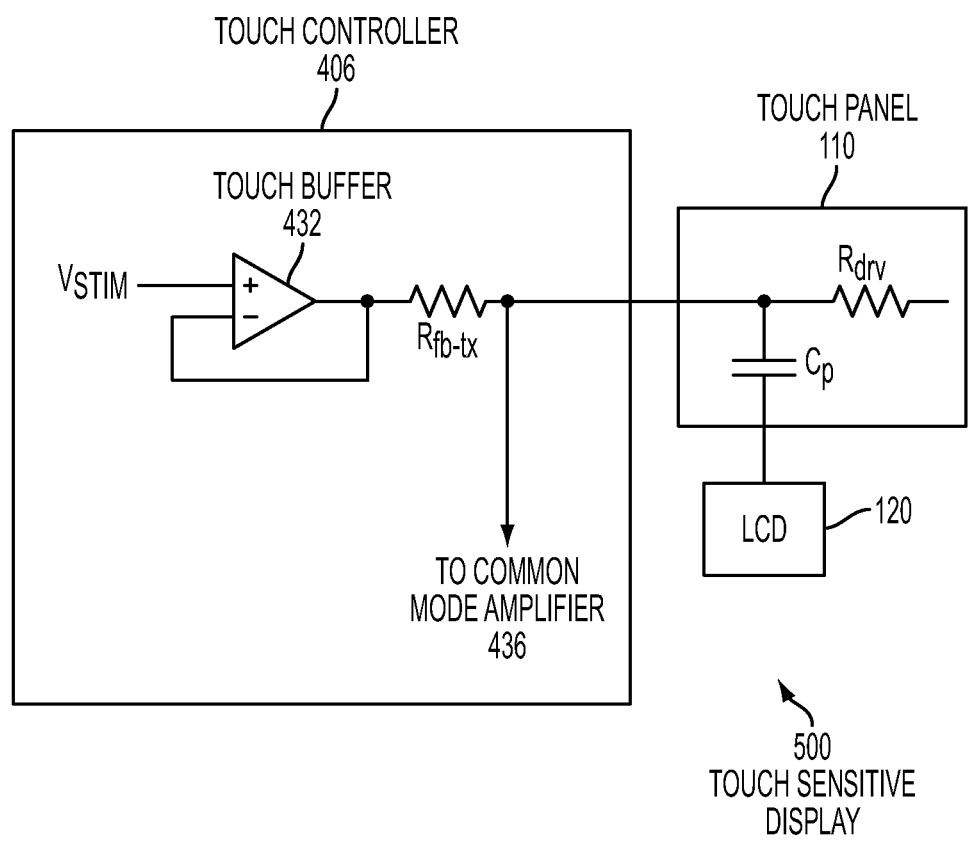
FIG. 5 illustrates another exemplary noise rejection circuit for a touch sensitive display according to various embodiments.
Figure 6:
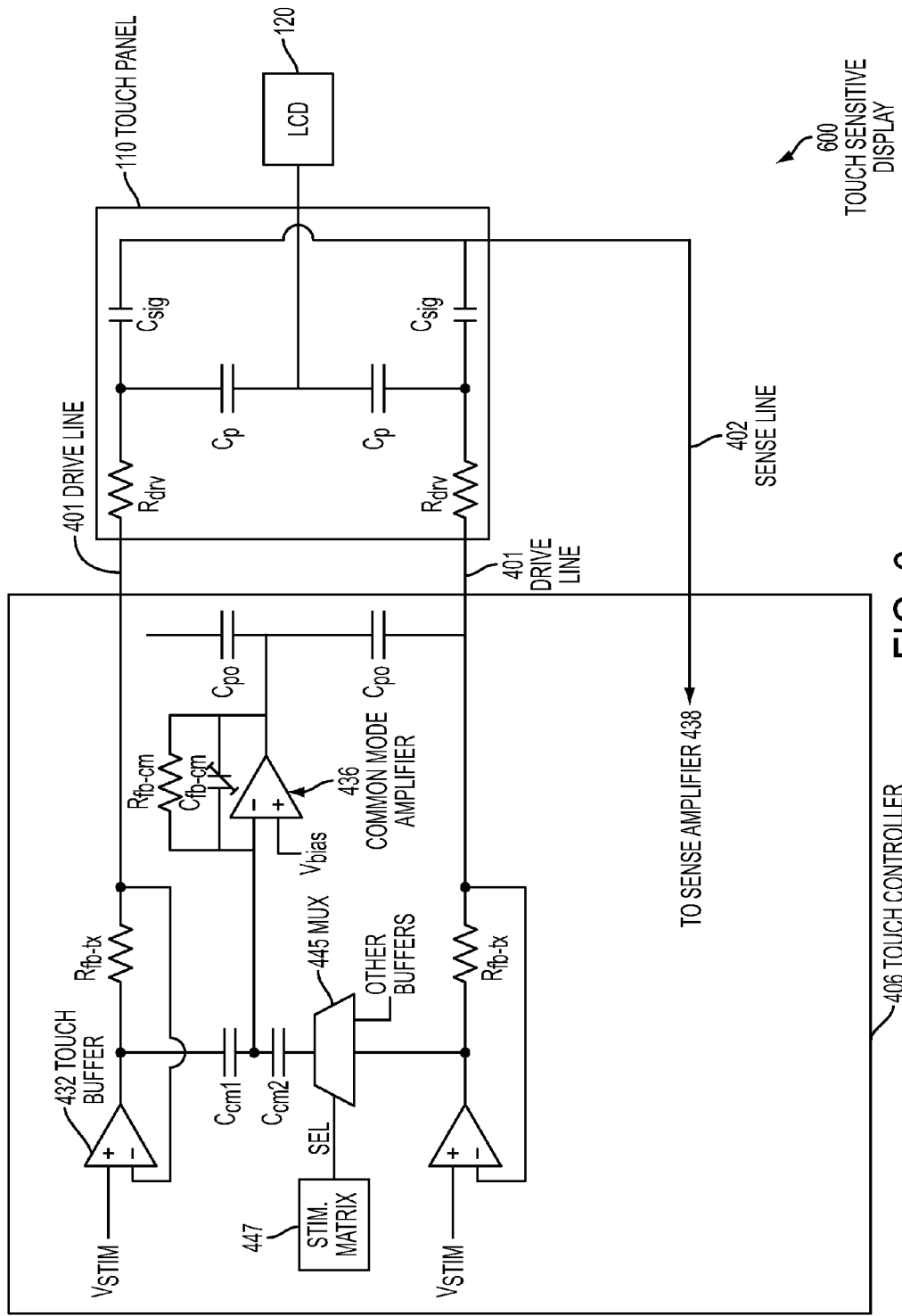
FIG. 6 illustrates still another exemplary noise rejection circuit for a touch sensitive display according to various embodiments.

Although only two touch buffers and one sense amplifier are shown in FIG. 4, it is to be understood that additional buffers and amplifiers can also be included according to the drive and sense line numbers and configurations of the touch sensitive display. It is further to be understood that a noise rejection circuit is not limited to that of FIG. 4, but can include additional and/or other components and configurations according to various embodiments. FIGS. 5 and 6 illustrate exemplary alternate configurations.

FIG. 5 illustrates an alternate configuration for the touch buffer resistor. In the example of FIG. 5, rather than have the resistor Rfb_tx in a feedback loop of the touch buffer 432, the resistor Rfb_tx can be connected between the output of the buffer and the touch panel 110. As such, Vcom can be coupled to the output of the touch buffer 432 into the input of the common mode amplifier 436, as a function of the resistor size, in preparation for noise rejection at the display 400.

FIG. 6 illustrates an alternate configuration for the output touch circuitry from the common mode amplifier. In the example of FIG. 6, rather than canceling the Vcom signal from the output of the touch panel, the Vcom signal can be canceled from the input to the touch panel. The output of the common mode amplifier 436 can be capacitively coupled (illustrated by Cpo) to the touch buffer outputs and inputted to the touch panel 110 for driving the touch panel. As mentioned previously, the touch buffer outputs can include Vstim and Vcom signals. By combining the buffer outputs with the common mode amplifier output, the Vcom signals can cancel each other out, leaving only the Vstim signals as input to the touch panel 110. Hence, the Vcom noise component has been rejected.

Figure 9:
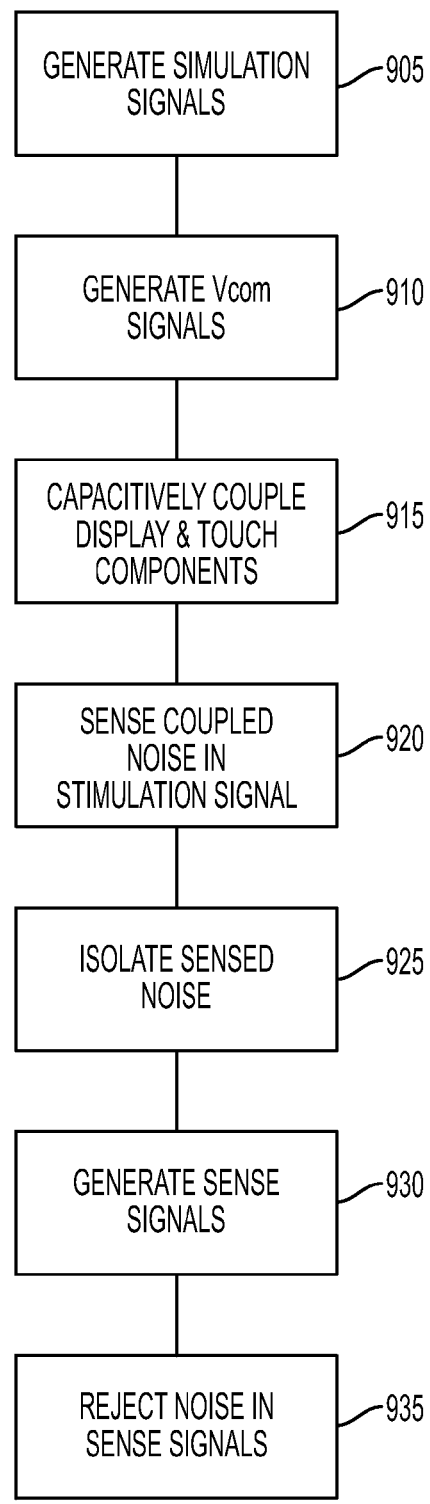
FIG. 9 illustrates an exemplary method for rejecting noise in a touch sensitive display according to various embodiments.

FIG. 9 illustrates an exemplary method for rejecting noise in a touch sensitive display according to various embodiments. In the example of FIG. 9, stimulation signals Vstim can be generated for driving a touch panel of a touch sensitive display to sense a touching or hovering object (905). The stimulation signals Vstim can be positive (+) phase signals and negative (−) phase signals, depending on the drive pattern of the display. Common voltage signals Vcom can be generated for driving an LCD of the touch sensitive display to display data (910). The LCD can undesirably capacitively couple with the touch panel, such that the Vcom signals appear as noise on the touch panel, thereby interfering with touch and hover sensing (915).

Noise rejection circuitry can sense the Vcom signals introduced into the touch panel (920). In some embodiments, the Vcom signals can be sensed by a feedback resistor in a touch buffer of the touch sensitive display, as described previously. The noise rejection circuitry can then isolate the sensed Vcom signals from the Vstim signals (925). In some embodiments, the Vcom signals can be isolated from the Vstim signals using a common mode amplifier to cancel out the Vstim signals at its input, leaving the Vcom signals, as described previously.

The Vstim signals, having the Vcom signals therein, can drive the touch panel, causing the touch panel to generate sense signals that include the Vcom signals (930). The sense signals can indicate the sensed object. The noise rejection circuitry can then subtract the isolated Vcom signals from the sense signals having the Vcom signals therein, resulting in sense signals substantially free of the Vcom noise (935). In some embodiments, the isolated Vcom signals can be subtracted from the sense signals at an input to a sense amplifier of the touch sensitive display, leaving the sense signals substantially free of the Vcom signals, as described previously.

Figure 11:
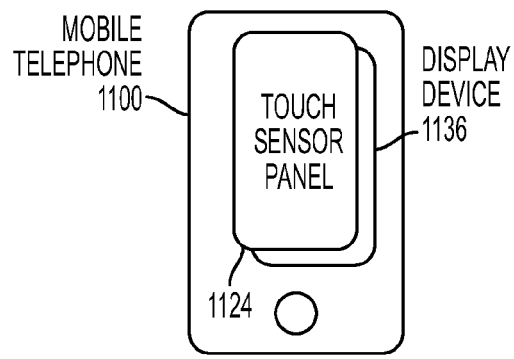
FIG. 11 illustrates an exemplary mobile telephone having noise rejection circuitry according to various embodiments.

It is to be understood that noise rejection is not limited to the method of FIG. 11, but can include additional and/or other actions according to various embodiments.

Figure 10:
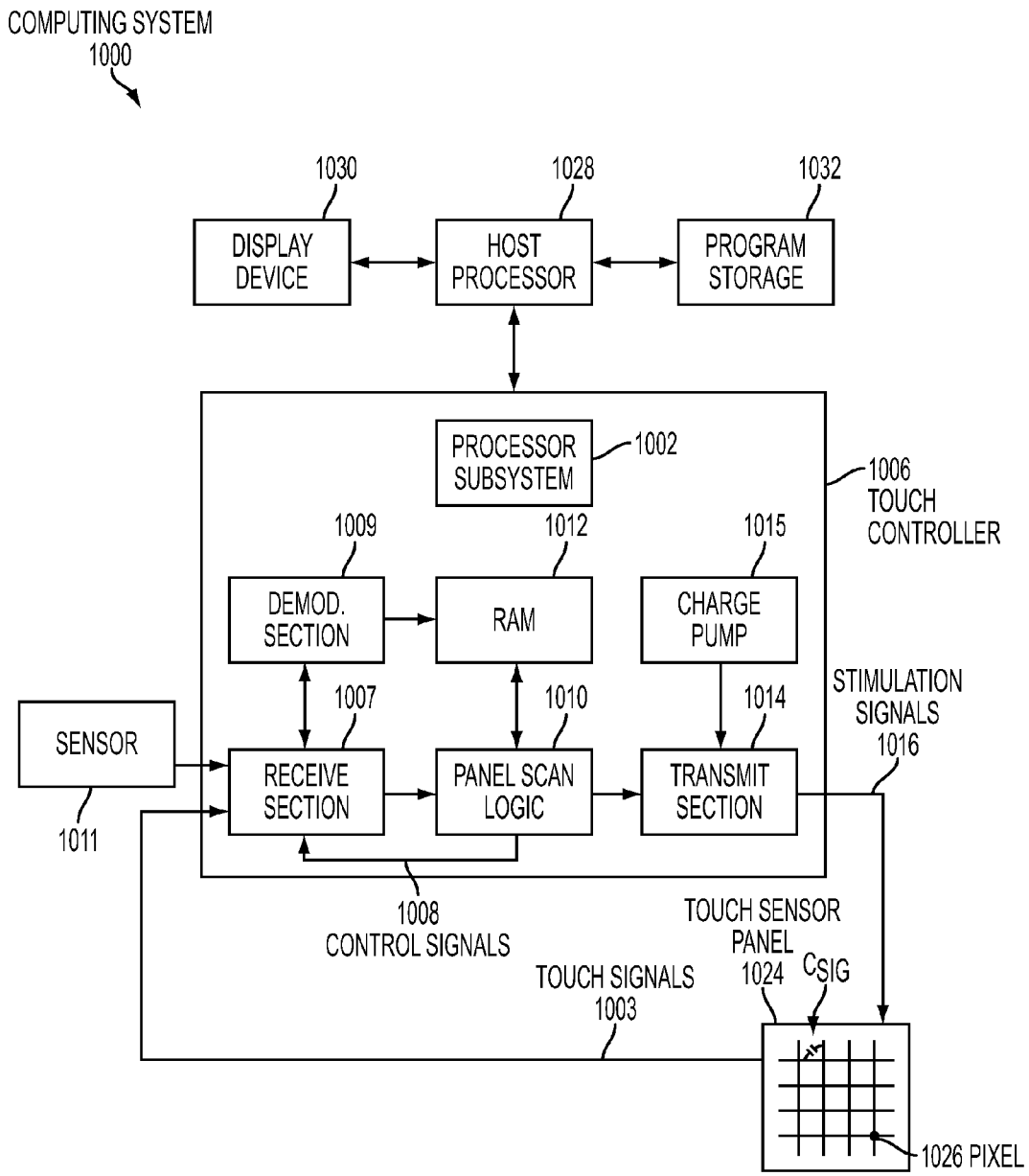
FIG. 10 illustrates an exemplary computing system having noise rejection circuitry according to various embodiments.

FIG. 10 illustrates an exemplary computing system 1000 that can have a noise rejection circuit according to various embodiments described herein. In the example of FIG. 10, computing system 1000 can include touch controller 1006. The touch controller 1006 can be a single application specific integrated circuit (ASIC) that can include one or more processor subsystems 1002, which can include one or more main processors, such as ARM968 processors or other processors with similar functionality and capabilities. However, in other embodiments, the processor functionality can be implemented instead by dedicated logic, such as a state machine. The processor subsystems 1002 can also include peripherals (not shown) such as random access memory (RAM) or other types of memory or storage, watchdog timers and the like.

The touch controller 1006 can also include receive section 1007 for receiving signals, such as sense signals 1003 of one or more touch sense channels (not shown) and other signals from other sensors such as sensor 1011, etc. The receive section 1007 can include noise rejection circuitry according to various embodiments. The touch controller 1006 can also include demodulation section 1009 such as a multistage vector demodulation engine, panel scan logic 1010, and transmit section 1014 for transmitting stimulation signals 1016 to touch sensor panel 1024 to drive the panel and to force sensor bridge 1036 to drive the bridge. The panel scan logic 1010 can access RAM 1012, autonomously read data from the sense channels, and provide control for the sense channels. In addition, the panel scan logic 1010 can control the transmit section 1014 to generate the stimulation signals 1016 at various frequencies and phases that can be selectively applied to rows of the touch sensor panel 1024. The transmit section 1014 can also include noise rejection circuitry according to various embodiments.

The touch controller 1006 can also include charge pump 1015, which can be used to generate the supply voltage for the transmit section 1014. The stimulation signals 1016 can have amplitudes higher than the maximum voltage by cascading two charge store devices, e.g., capacitors, together to form the charge pump 1015. Therefore, the stimulus voltage can be higher (e.g., 6V) than the voltage level a single capacitor can handle (e.g., 3.6 V). Although FIG. 10 shows the charge pump 1015 separate from the transmit section 1014, the charge pump can be part of the transmit section.

Computing system 1000 can also include touch sensor panel 1024, which can be as described above in FIG. 2, and display device 1030, which can be as described above in FIG. 3, for example.

Computing system 1000 can include host processor 1028 for receiving outputs from the processor subsystems 1002 and performing actions based on the outputs that can include, but are not limited to, moving an object such as a cursor or pointer, scrolling or panning, adjusting control settings, opening a file or document, viewing a menu, making a selection, executing instructions, operating a peripheral device coupled to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. The host processor 1028 can also perform additional functions that may not be related to panel processing, and can be coupled to program storage 1032 and display device 1030 for providing a UI to a user of the device. In some embodiments, the host processor 1028 can be a separate component from the touch controller 1006, as shown. In other embodiments, the host processor 1028 can be included as part of the touch controller 1006. In still other embodiments, the functions of the host processor 1028 can be performed by the processor subsystem 1002 and/or distributed among other components of the touch controller 1006. The display device 1030 together with the touch sensor panel 1024, when located partially or entirely under the touch sensor panel or when integrated with the touch sensor panel, can form a touch sensitive display.

Note that one or more of the functions described above, can be performed, for example, by firmware stored in memory (e.g., one of the peripherals) and executed by the processor subsystem 1002, or stored in the program storage 1032 and executed by the host processor 1028. The firmware can also be stored and/or transported within any non-transitory computer readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer readable storage medium" can be any non-transitory medium that can contain or store the program for use by or in connection with the instruction execution system, apparatus, or device. The computer readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport medium can include, but is not limited to, an electronic, magnetic, optical, electromagnetic or infrared wired or wireless propagation medium.

It is to be understood that the touch sensor panel is not limited to touch, as described in FIG. 10, but can be a proximity panel or any other panel according to various embodiments. In addition, the touch sensor panel described herein can be a multi-touch sensor panel.

It is further to be understood that the computing system is not limited to the components and configuration of FIG. 10, but can include other and/or additional components in various configurations capable of noise rejection according to various embodiments.

FIG. 11 illustrates an exemplary mobile telephone 1100 that can include noise rejection circuitry capable of operating on touch panel 1124, display device 1136, and other computing system blocks according to various embodiments.

Figure 12:
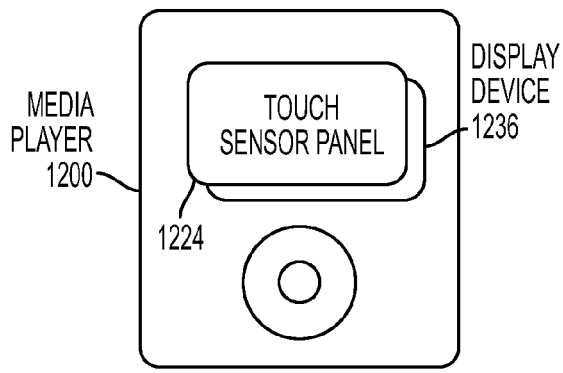
FIG. 12 illustrates an exemplary digital media player having noise rejection circuitry according to various embodiments.

FIG. 12 illustrates an exemplary digital media player 1200 that can include noise rejection circuitry capable of operating on touch panel 1224, display device 1236, and other computing system blocks according to various embodiments.

Figure 13:
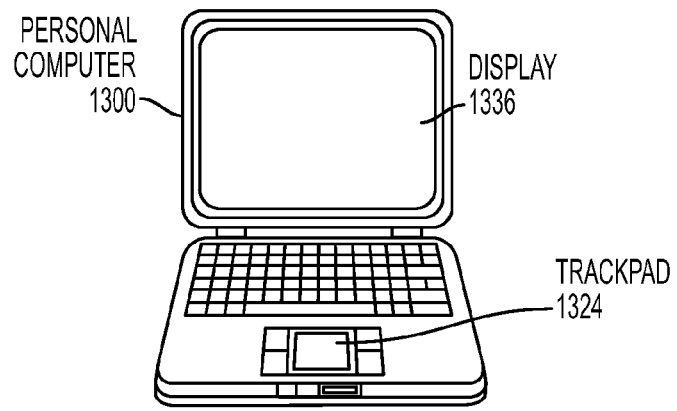
FIG. 13 illustrates an exemplary portable computer having noise rejection circuitry according to various embodiments.

FIG. 13 illustrates an exemplary personal computer 1300 that can include noise rejection circuitry capable of operating on touch pad 1324, display 1336, and other computing system blocks according to various embodiments.

The mobile telephone, media player, and personal computer of FIGS. 11 through 13 can provide larger and thinner touch sensitive displays with improved touch and hover sensing by operating noise rejection circuitry in the displays according to various embodiments.

Although touch sensitive displays are described herein, it is to be understood that other touch sensitive devices can also be used according to various embodiments. For example, a touch sensitive device, e.g., a trackpad, having a touch sensor panel and underlying circuitry (without a display device) can include noise rejection circuitry, as illustrated in FIGS. 4 through 6, to reject noise introduced by the underlying circuitry (rather than an LCD) into the panel, according to the method illustrated in FIG. 9.

In this example, the underlying circuitry of the touch sensitive device can capacitively couple to the touch panel to introduce a voltage signal (as noise) into the stimulation signals. In FIG. 4, the resistor Rfb_tx can be used to sense the voltage signal, the stimulation matrix and multiplexor can be used to select touch buffers for coupling stimulation signals including the voltage signal, the common mode amplifier can be used to isolate the voltage signal, and the touch circuitry can be used to couple the isolated voltage signal with the sense signals to cancel the voltage signal from the sense signals. Similarly, in FIG. 5, the resistor Rfb_tx can be used to sense the voltage signal. In FIG. 6, the touch circuitry can be used to couple the isolated voltage signal from the common mode amplifier with the output of the touch buffers to cancel the voltage signal from the stimulation signals.

Additionally, in this example, in the method of FIG. 9, stimulation signals can be generated to drive the touch panel and voltage signals can be generated by the underlying circuitry. The touch panel and the underlying circuitry can capacitively couple to introduce the voltage signals into the touch panel as noise. The coupled noise can be sensed and isolated from the stimulation signals by noise rejection circuitry. Sense signals can be generated by the touch panel, indicative of a touch or hover. The sense signals and the isolated noise can be coupled to reject the noise in the sense signals.

Although embodiments have been fully described with reference to the accompanying drawings, it is to be noted that various changes and modifications will become apparent to those skilled in the art. Such changes and modifications are to be understood as being included within the scope of the various embodiments as defined by the appended claims.

What is claimed is:

1. A touch sensitive display comprising:
    a touch panel configured to sense an object proximate to the panel;
    a display device configured to display data; and
    touch circuitry including a noise rejection circuit to reject noise introduced by the display device into the touch panel, the touch circuitry configured for rejecting the noise by combining touch panel stimulation signals to generate a noise signal, and combining the noise signal with a sense signal from the touch panel.

2. The touch sensitive display of claim 1, wherein the touch circuitry comprises a plurality of touch buffers configured to transmit the stimulation signals to the touch panel to cause the panel to sense the proximate object, and
    wherein the touch circuitry comprises a resistor disposed in a feedback loop of at least some of the touch buffers and configured to sense the noise.

3. The touch sensitive display of claim 2, wherein the resistor is variable so as to adjust a gain of the touch buffer to sense the noise.

4. The touch sensitive display of claim 1, wherein the touch circuitry comprises a plurality of touch buffers configured to transmit the stimulation signals to the touch panel to cause the panel to sense the proximate object, and
    wherein the touch circuitry comprises a resistor disposed between at least some of the touch buffers and the touch panel and configured to sense the noise.

5. The touch sensitive display of claim 1, wherein the touch circuitry is configured to combine the touch panel stimulation signals by generating a coupled signal of a first stimulation signal having a first polarity and including the noise and a second stimulation signal having an opposite polarity and including the noise, the coupling canceling out the first and second stimulation signals, and
    wherein the touch circuitry comprises an amplifier configured to receive the coupled signal and isolate the noise in the coupled signal to generate the noise signal.

6. The touch sensitive display of claim 1, wherein the touch circuitry comprises:
    a multiplexor configured to select a stimulation signal having a first polarity from among multiple stimulation signals, and
    a stimulation matrix configured to control the selection by the multiplexor based on a drive pattern of the touch panel,
    wherein the touch circuitry is configured to combine the touch panel stimulation signals by generating a coupled signal of the selected stimulation signal and another stimulation signal having an opposite polarity, the coupling canceling out the selected and other stimulation signals, and
    wherein the touch circuitry comprises an amplifier configured to receive the coupled signal and isolate the noise in the coupled signal to generate the noise signal.

7. The touch sensitive display of claim 1, wherein the touch circuitry is configured to isolate the noise by generating the noise signal, and
wherein the touch circuitry is configured to combine the noise signal with the sense signal to cancel out the noise with the isolated noise.

8. The touch sensitive display of claim 1, wherein the touch panel is configured to generate a plurality of sense signals having variable amounts of the noise, and
wherein the touch circuitry is configured to isolate the noise and to vary the amounts of isolated noise so as to cancel out the variable noise amounts in the plurality of sense signals.

9. The touch sensitive display of claim 1, wherein the touch panel comprises:
a first set of conductive lines configured to drive the panel to sense the proximate object; and
a second set of conductive lines configured to transmit a plurality of sense signals indicative of the sensed proximate object for further processing.

10. The touch sensitive display of claim 1, wherein the display device comprises:
a transistor layer configured to be driven by a voltage layer to display the data.

11. The touch sensitive display of claim 1 incorporated into at least one of a mobile telephone, a digital media player, or a portable computer.

12. The touch sensitive display of claim 1, wherein the touch circuitry comprises a touch controller and the noise rejection circuit comprises a common mode amplifier configured for generating the noise signal.

13. A circuit for rejecting noise in a touch sensitive display, comprising:
multiple touch buffers configured to output stimulation signals to drive the display, the signals including noise; and
an amplifier configured to isolate the noise from the stimulation signals,
wherein at least two of the stimulation signals are coupled together to form a coupled signal, the coupling canceling the stimulation signals and leaving the noise in the coupled signal, and
wherein the amplifier is configured to receive the coupled signal to isolate the noise in the coupled signal for rejection.

14. The circuit of claim 13, wherein the amplifier comprises an adjustable capacitor configured to adjust a gain of the amplifier to isolate the noise.

15. The circuit of claim 13, comprising:
a multiplexor configured to select at least one of the stimulation signals having a first polarity; and
a stimulation matrix configured to send a selection signal to the multiplexor to make the selection,
wherein the at least one stimulation signal is coupled with at least another of the stimulation signals having a second polarity opposite the first polarity so as to cancel the at least one stimulation signal and the at least another stimulation signals.

16. A circuit for rejecting noise in a touch sensitive display, comprising:
multiple touch buffers configured to output stimulation signals to drive the display, the stimulation signals including noise;
a noise amplifier coupled to the outputs of the touch buffers and configured to isolate the noise from the stimulation signals to form a noise signal; and
a sense amplifier configured to receive sense signals generated from the stimulation signals with the noise rejected therefrom, the noise being rejected by applying the noise signal in the display.

17. The circuit of claim 16, wherein the noise is rejected by applying the noise signal to the sense signals so as to remove the noise from the sense signals.

18. The circuit of claim 16, wherein the noise is rejected by applying the noise signal to the stimulation signals so as to remove the noise from the stimulation signals.

19. A method for rejecting noise in a touch sensitive device, comprising:
driving the device with stimulation signals, the stimulation signals including capacitively coupled noise;
sensing the noise in the stimulation signals;
isolating the noise in the stimulation signals to produce a noise signal;
generating sense signals from the stimulation signals, the sense signals including the noise; and
applying the noise signal to the sense signals so as to reject the noise in the sense signals.

20. The method of claim 19, wherein isolating the noise comprises coupling at least two of the stimulation signals having opposite polarity so as to cancel the stimulation signals and leave the noise.

21. The method of claim 19, wherein applying the noise signal comprises subtracting the noise signal from the sense signal.

22. A touch sensitive device comprising:
a touch panel configured to sense an object proximate to the panel;
a voltage circuit proximate to the panel; and
touch circuitry including a noise rejection circuit to reject noise introduced by the voltage circuit into the touch panel, the touch circuitry configured for rejecting the noise by combining touch panel stimulation signals to generate a noise signal, and combining the noise signal with a sense signal from the touch panel.

23. The device of claim 22, wherein the touch circuitry comprises a resistor configured to sense the noise.

24. The device of claim 22, wherein the touch circuitry comprises a common mode amplifier configured to isolate the noise.

25. The device of claim 22, wherein the touch panel is configured to generate a plurality of sense signals indicative of the proximate object and the touch circuitry is configured to reject the noise from the sense signals.

26. The touch sensitive device of claim 22, wherein the touch circuitry comprises a touch controller and the noise rejection circuit comprises a common mode amplifier configured for generating the noise signal.

* * * * *